(12) United States Patent
Wilby et al.

(10) Patent No.: US 10,153,135 B2
(45) Date of Patent: Dec. 11, 2018

(54) PLASMA ETCHING APPARATUS

(71) Applicant: SPTS Technologies Limited, Newport (GB)

(72) Inventors: Anthony Paul Wilby, Bristol (GB); Stephen R Burgess, Gwent (GB); Ian Moncrieff, Wotton-Under-Edge (GB); Paul Densley, Newport (GB); Clive L Widdicks, Bristol (GB); Paul Rich, Bristol (GB); Adrian Thomas, Newport (GB)

(73) Assignee: SPTS TECHNOLOGIES LIMITED, Newport (GB)

( * ) Notice: Subject to any disclaimer, the term of this patent is extended or adjusted under 35 U.S.C. 154(b) by 0 days.

(21) Appl. No.: 15/190,722

(22) Filed: Jun. 23, 2016

(65) Prior Publication Data

US 2016/0379807 A1 Dec. 29, 2016

(30) Foreign Application Priority Data

Jun. 26, 2015 (GB) .................................. 1511282.4

(51) Int. Cl.
*H01J 37/32* (2006.01)
*H01L 21/67* (2006.01)
*C23C 14/34* (2006.01)

(52) U.S. Cl.
CPC ........ *H01J 37/32495* (2013.01); *C23C 14/34* (2013.01); *H01J 37/321* (2013.01); *H01J 37/32642* (2013.01); *H01J 37/32715* (2013.01); *H01L 21/67069* (2013.01); *H01J 2237/334* (2013.01)

(58) Field of Classification Search
CPC .............. H01J 37/32495; H01J 37/321; H01J 37/32715; H01L 21/67069; H01L 21/67063; C23C 14/34
See application file for complete search history.

(56) References Cited

U.S. PATENT DOCUMENTS

| | | |
|---|---|---|
| 5,380,414 A | 1/1995 | Tepman |
| 6,143,144 A * | 11/2000 | Golovato ............... H01J 37/321 |
| 6,270,621 B1 | 8/2001 | Tam et al. |
| 6,423,175 B1 | 7/2002 | Huang et al. |
| 6,660,140 B2 | 12/2003 | Buchanan et al. |
| 7,176,140 B1 | 2/2007 | Rivkin et al. |
| 8,486,798 B1 | 7/2013 | Chen et al. |
| 2003/0013314 A1 | 1/2003 | Ying et al. |
| 2003/0181065 A1* | 9/2003 | O'Donnell ................ C23C 4/02 438/778 |

(Continued)

*Primary Examiner* — John J Brayton
(74) *Attorney, Agent, or Firm* — Volentine, Whitt & Francos, PLLC

(57) ABSTRACT

An ICP plasma etching apparatus for etching a substrate includes at least one chamber, a substrate support positioned within the chamber, a plasma production device for producing a plasma for use in etching the substrate, and a protective structure which surrounds the substrate support so that, in use, a peripheral portion of the substrate is protected from unwanted deposition of material. The protective structure is arranged to be electrically biased and is formed from a metallic material so that metallic material can be sputtered from the protective structure onto an interior surface of the chamber to adhere particulate material to the interior surface.

22 Claims, 6 Drawing Sheets

(56) References Cited

U.S. PATENT DOCUMENTS

| | | | |
|---|---|---|---|
| 2004/0261946 A1* | 12/2004 | Endoh | H01J 37/32082 |
| | | | 156/345.15 |
| 2006/0090706 A1 | 5/2006 | Miller et al. | |
| 2009/0142512 A1 | 6/2009 | Forster et al. | |
| 2010/0243606 A1* | 9/2010 | Koshimizu | H01J 37/32091 |
| | | | 216/67 |
| 2010/0304572 A1 | 12/2010 | Koshimizu | |
| 2011/0240221 A1 | 10/2011 | Yamamoto et al. | |
| 2014/0254061 A1* | 9/2014 | Shiraiwa | H01L 21/6831 |
| | | | 361/234 |
| 2015/0170925 A1 | 6/2015 | Chen et al. | |
| 2015/0181684 A1 | 6/2015 | Banna et al. | |

\* cited by examiner (a)

(b)

(a)

(b)

PLASMA ETCHING APPARATUS

BACKGROUND

This invention relates to an ICP plasma etching apparatus for etching a substrate, methods of reducing contamination, and to protective structures for plasma etching apparatus of this kind.

Plasma etching is widely used to process a variety of substrates, such as semiconductor wafers. The plasma etching process may be a step process which forms part of a process sequence. For example, in the semiconductor industry it is well known to remove materials from a wafer surface by a sputter etch process prior to a subsequent metal deposition step. The sputter etch process is typically performed using an Argon plasma. The purpose is to ensure a high quality metal/metal interface resulting in a low contact resistance. The sputter etch step is typically conducted in a pre-clean module.

In operation, it is observed that prolonged etching can result in a build up of redeposited particulate material around the interior surfaces of the sputter etch chamber, such as the chamber lid and walls. This is a particular problem with the etching of organic materials such as polyimide (PI) and polybenzoxazole (PBO) which can lead to a build up or redeposition of carbonaceous material. This redeposited particulate material can accumulate to a point where the particles become loose and there is the potential for them to fall onto and contaminate the wafer.

A further problem is associated with wafers that contain substances which outgas heavily. Examples of such substances are organic passivation layers, adhesives, photoresists and spin-on materials. Again, PI and PBO are especially problematic. When these materials outgas, contaminants are released into the chamber which raises the pressure. This can cause significant problems in recovering acceptable vacuum levels in the chamber between the processing of successive wafers.

The conventional solution to these problems is to perform a maintenance procedure on a frequent basis. This ultimately results in the chamber being vented to atmosphere so that a mechanical clean can be carried out. This intervention has a significant cost and tool downtime. This is not desirable in a production environment. Instead, it would be desirable to reduce the frequency of the maintenance interventions. This would reduce cost whilst improving the uptime of the tool.

It is also known to periodically etch a metallic disc or a metallised wafer in order to extend the mean time between cleans of the chamber. The chamber typically comprises a ceramic or quartz sidewall through which RF energy is inductively coupled to form a plasma in the chamber. It is important that this portion of the chamber is protected against the formation of a continuous metal deposition. Otherwise, severe attenuation of the inductively coupled power can occur. The etching of the metallic disc or metallised wafer results in the etch material "pasting" any loose particulate material onto an interior surface of the chamber. This prevents the particulate material from falling onto the substrate. However, normal manufacturing must be interrupted to perform the etching of the metallic disc or metallised wafer. Therefore, these techniques are disruptive to normal manufacturing, which results in a loss of system throughput and an increased cost of ownership (COO).

SUMMARY

The present invention, in at least some of its embodiments, addresses one or more of the above-described problems. Although the invention is particularly suited to sputter etch processes, such as sputter etch processes conducted in a pre-clean module, the invention is not limited in this respect. Instead, the invention can be applied to a wide range of plasma etching processes.

According to a first aspect of the invention there is provided an ICP (inductively coupled plasma) plasma etching apparatus for etching a substrate comprising:

at least one chamber;

a substrate support positioned within the chamber;

a plasma production device for producing a plasma for use in etching the substrate; and a protective structure which surrounds the substrate support so that, in use, a peripheral portion of the substrate is protected from unwanted deposition of material;

in which the protective structure is arranged to be electrically biased and is formed from a metallic material so that metallic material can be sputtered from the protective structure onto an interior surface of the chamber to adhere particulate material to the interior surface.

In this way, the problem of particulate deposition is addressed. This can reduce the frequency with which maintenance operations are required. This in turn can reduce running costs and improve the uptime of the apparatus. Additionally, the present inventors have realised that it is possible to sputter the protective structure to adhere particulate material to the interior surface of the chamber concurrently with the etching of the substrate. This is extremely convenient, and increases system throughput.

The metallic material may be a metal or a metal alloy.

The metallic material may be aluminium, an aluminium alloy, or copper.

Where the metallic material is a metal alloy, the alloy may comprise a metal alloyed with one or more other metal, and/or a metal alloyed with one or more non-metallic materials. For example, the protective structure may be formed from an aluminium alloy which may comprise copper, silicon, or both copper and silicon. Typically, the copper and/or silicon is present at less than 5 at. %

The metallic material may also be a getter material. The getter material may be a material which removes one or more gaseous species present in the chamber. The getter material may react with or absorb a gaseous species present in the chamber. The getter material may be titanium or tantalum. In this way, unwanted gaseous species present due to outgassing can be removed.

Typically, the protective structure is a ring structure. The protective structure, e.g., the ring structure, may comprise a body of metallic material having an upper part situated above the level of a support surface of the substrate support so as to surround the substrate received on the support surface so that a peripheral portion of the substrate is protected from unwanted deposition of material, and a lower part situated below the level of the support surface of the substrate support so that the protective structure surrounds the substrate support. Accordingly, the protected portion of the substrate may include the underside of the substrate. Ring structures of this type are commonly known as "back sputter rings" or "uniformity rings". Typically, a portion of the ring structure is configured to receive a peripheral portion of the substrate. Typically, the ring structure is a single, continuous ring structure. However, the principles described herein extend also to other forms of protective structures such as multiple ring structures.

The protective structure may have a substrate receiving surface. The protective structure may comprise a recess, and the substrate receiving surface may form part of the recess.

A region of the protective structure which, in use, is proximal to the substrate may be formed from a dielectric material. The dielectric material may be present as a coating on the protective structure.

The protective structure may have a substrate receiving surface which is formed from the dielectric material. The protective structure may comprise a recess, with the substrate receiving surface forming part of the recess. The recess may comprise the substrate receiving surface and a wall portion. The substrate receiving surface and the wall portion may be formed from the dielectric material.

The dielectric material may be aluminium oxide.

The protective structure may comprise a region distal from the substrate support having at least one plasma facing surface which is inclined away from the substrate support. In this way, the spatial distribution of sputtered metallic material from the protective structure can be controlled to maximise deposition of sputtered metallic material in the region of the chamber where the deposition of particulate material is most prevalent. A further advantage is that deposition of sputtered metallic material from the protective structure onto the substrate can be minimised.

The region distal from the substrate support may have a single plasma facing surface which is inclined away from the substrate support.

The region distal from the substrate support may be chamfered, bevelled, coved or of ogee shape.

The apparatus may further comprise a dark space shield. The dark space shield may surround the substrate support and have a protective structure receiving portion for receiving the protective structure. The substrate support may comprise a platen for receiving the substrate which defines a level. The protective structure receiving portion may be disposed below this level. Traditionally, dark space shields extend at least up to the level of the platen so as to minimise the formation of plasma in the gap between the substrate and the lower region of the substrate support. In contrast, dark space shields provided by the present invention may be configured so that they do not extend so far vertically into the chamber. As a consequence, plasma can extend further around the protective structure. This can enhance the sputtering of metallic material from the protective structure.

In use, the substrate support is electrically biased. The protective structure may be in electrical contact with the substrate support to provide an electrical bias on the protective structure. In practice, this is likely to be the more convenient arrangement. However, in principle it may be possible to independently electrically bias the protective substrate.

Typically, the protective structure and/or the substrate support are electrically biased with an RF voltage.

The chamber may comprise a region formed from a dielectric material for transmission of RF energy. The plasma production device may cause the RF energy to be coupled into the chamber through said region. The dielectric material that said region is formed from may be a ceramic or quartz. The region may comprise a window or wall of the chamber.

The plasma etching apparatus may be a sputter etch apparatus.

The plasma etching apparatus may be an Argon sputter etch apparatus.

The plasma production device may comprise an electrically conductive element. Typically, the electrically conductive element is positioned outside of the chamber. The electrically conductive element may be a coil.

The apparatus may further comprise an RF electrical power supply for supplying an RF bias power to one or both of the substrate support and the protective structure.

Typically the plasma etching apparatus comprises a single chamber. However, multiple chamber apparatus are also within the scope of the invention.

The plasma etching apparatus may be a pre-clean module for use in a (multi-processing) cluster tool.

The plasma production device may comprise an electrical generator, preferably an RF generator, which supplies electrical power to the electrically conductive element. The plasma may be produced by inductive coupling of the electrical power supplied to the electrically conductive element.

According to a second aspect of the invention, there is provided a method of reducing contamination by particulate material in a plasma etching apparatus of the kind used for etching a substrate comprising the steps of:

providing an apparatus according to the first aspect of the invention; and producing a plasma in the chamber which sputters metallic material from the protective structure onto an interior surface of the chamber to adhere particulate material to the interior surface of the chamber.

The sputtering of the metallic material from the protective structure may be performed concurrently with the etching of the substrate. This provides considerable advantages in terms of throughput. Additionally, it reduces disruption of the normal manufacturing process.

The protective structure may be electrically biased during the step of producing a plasma in the chamber.

According to a third aspect of the invention there is provided a protective structure for the plasma etching apparatus of the first aspect of the invention, the protective structure being configured to surround the substrate support of the apparatus so that, in use, a peripheral portion of the substrate is protected from unwanted deposition of material, in which the protective structure is formed from a metallic material which can be sputtered onto an interior surface of the chamber of the apparatus to adhere particulate material to the interior surface.

According to a fourth aspect of the invention the is provided a cluster tool for processing a workpiece comprising a plurality of processing modules, in which one of the modules is a pre-clean module comprising plasma etching apparatus of the first aspect of the invention.

Whilst the invention has been described above, it extends to any inventive combination of the features set out above or in the following description, drawings or claims. For example, any feature described in relation to the first aspect of the invention is considered to be disclosed also in relation to the second aspect of the invention and vice versa.

BRIEF DESCRIPTION OF THE DRAWINGS

Embodiments of apparatus, protective structures, and methods of etching in accordance with the invention will now be described with reference to the following drawings, in which.

DETAILED DESCRIPTION OF EMBODIMENTS

Figure 1:
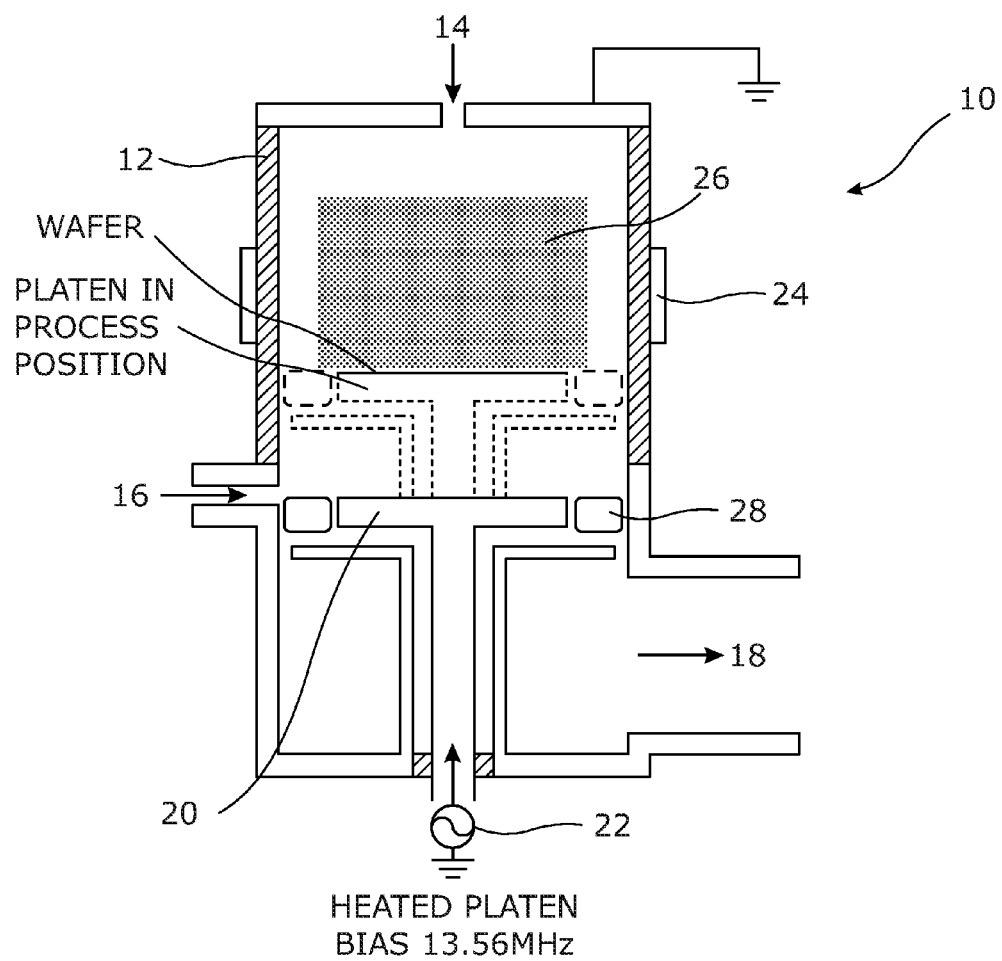
FIG. 1 is a cut-away view of a plasma etching apparatus.

FIG. 1 shows an example of a plasma etching apparatus of the invention, depicted generally at 10. The apparatus 10 comprises a chamber 12 having a suitable gas inlet 14 disposed in a top portion thereof. The chamber 12 further comprises a wafer loading slot 16 and a pumping port 18 which may be connected to a suitable pumping arrangement such as a vacuum line leading to a turbomolecular pump. The interior of the chamber 12 houses a platen 20 on which a workpiece such as a wafer may be loaded. The platen 20 as shown by solid lines in FIG. 1 is in a lowered position for receiving the workpiece. The platen 20 would then subsequently be raised into the position shown by the dotted lines in FIG. 1 prior to the commencement of an etch process. An RF power supply 22 is provided which provides an RF bias power to the platen 20. For convenience, an RF signal frequency of 13.56 MHz is used, although in principle other frequencies might be employed. The chamber 12 is surrounded by an inductive coil 24. The inductive coil 24 is connected to an RF power generator (not shown) through an impedance matching network (not shown) as is well known in the art. The walls of the chamber 12, at least in the vicinity of the inductive coil, are made from an electrically insulating material such as quartz or ceramic in order to minimise attenuation of RF power coupled to the chamber 12. A suitable process gas or gases are supplied to the chamber 12 through the gas inlet 14, and RF power is supplied to the coil 24 to produce a plasma 26 in the chamber 12. In one example, a gas (typically Argon) is introduced into the chamber 12 at a relatively low pressure (typically 1-10 mTorr) through a mass flow controller. The bias supply to the platen 20 is then used to accelerate ions from the plasma towards the workpiece, where ion bombardment etches the surface of the workpiece.

The apparatus 10 further comprises a protective structure in the form of a back sputter ring 28. The back sputter ring 28 is made from a metal or a metal alloy which may be sputter eroded from the surface of the back sputter ring 28. The material sputtered from the back sputter ring 28 then coats the internal surfaces and components of the chamber 12. Particulate material which has been deposited onto the internal surfaces and components of the chamber 12 is "pasted" in place by the material sputtered from the back sputter ring 28. In this way, the particulate material is securely adhered in place in the chamber by the sputtered metal or metal alloy material from the back sputter ring 28. This at least reduces the risk of particulate material falling onto the wafer.

Figure 2:
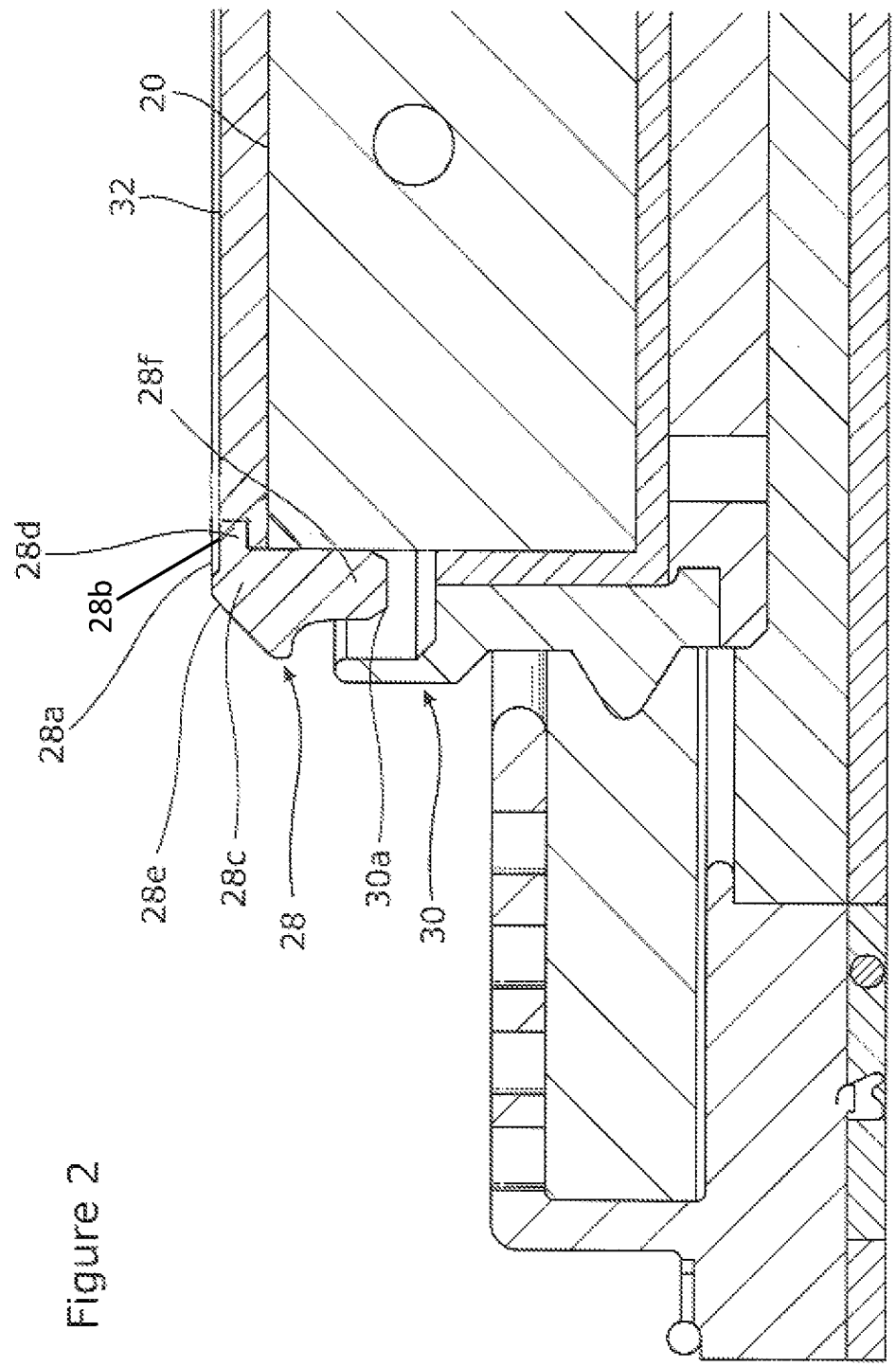
FIG. 2 is a cross-sectional view through a portion of the apparatus of FIG. 1 around a peripheral portion of the platen and back sputter ring.

FIG. 2 is a cross-sectional view through a portion of the chamber 12 around a peripheral portion of the platen 20 and back sputter ring 28. Identical reference numerals to those used in FIG. 1 are used in FIG. 2 to denote identical features. It can be seen that the apparatus 10 further comprises a dark space shield 30 of unconventional design. The other features shown in FIG. 2 are of essentially conventional type and their operation is well known by the skilled reader. Also shown in FIG. 2 is a recess 32 of support structure of the apparatus delimited by a support surface of the platen 20. The recess 32 receives the wafer (not shown) set on the support surface of the platen 20. The back sputter ring 28 comprises a recess 28a which is made up of a horizontal substrate receiving surface 28b and a substantially vertical surface of a wall portion 28c. The substrate receiving surface 28b is disposed radially inwardly of and subtends an angle with the substantially vertical surface of wall portion 28c. The recess 28a delimited by these surfaces constitutes a radially outer part of the recess 32. Also, the wall portion 28c having the substantially vertical surface my constitute an uppermost portion of the back sputter ring 28. Thus, the recess 28a is formed in an upper radially inner part of the back sputter ring 28 and an outer peripheral part of the wafer is received in the recess 28a. In this way, the back sputter ring 28 acts to protect the peripheral edge and the surface of the wafer from undesirable effects of the plasma, such as unwanted material deposition. The back sputter ring 28 further comprises a circular rim 28d which is received by a slot formed in the platen 20. This enables intimate contact to be made between the back sputter ring 28 and the platen 20 so that the back sputter ring 28 is in electrical contact with the platen 20. This ensures that both the platen 20 and the back sputter ring 28 are electrically biased by the RF power supply 22. The back sputter ring 28 further comprises a plasma facing surface 28e. In the example shown in FIG. 2, the plasma facing surface 28e is inclined away from the platen 20 and the wafer. Ions arriving at the wafer and back sputter ring 28 from the plasma are generally travelling in a vertically downward direction. The profile provided by the plasma facing surface 28e maximises the spatial distribution of the flux of sputtered material from the back sputtered ring 28 towards the portion of the chamber which is susceptible to contamination by particulate material. In particular, material sputtered from the back sputter ring 28 is substantially directed towards the region of the interior chamber walls which are close to the position of the coil 24. A related advantage is that this minimises the flux of sputtered material from the back sputtered ring 28 towards the wafer. As can be seen in FIG. 2, the plasma facing surface 28e is linear in its radial cross-section. The skilled reader will appreciate that many other profiles might be used in order to obtain similar results. For example, the plasma facing surface may be of curved radial cross-section, or a chamfered, beveled, coved or ogee profile might be used.

The dark space shield 30 is of unconventional design. More particularly, traditional, prior art dark space shields are usually configured so as to extend up to the level of the platen (at least to the lower surface of the platen). This is because the intention with prior art dark space shields is to reduce the extent of the plasma into the gap region between the platen and the bottom of the chamber. In comparison to dark space shields of this traditional kind, the dark space shield 30 shown in FIG. 2 is of a cut-off design having a shorter upstanding portion. It can be seen from FIG. 2 that the uppermost part of the dark space shield 30 is positioned someway below the level of the platen 20. The dark space shield 30 comprises a relatively shallow circumferential slot 30a which receives a downwardly depending circumferential wall 28f of the back sputter ring 28. As a result, the plasma 26 extends around the back sputter ring 28 in the gap between the platen 20 and the wafer and bottom of the chamber. This results in enhanced sputtering of the back sputter ring 28.

Figure 3:
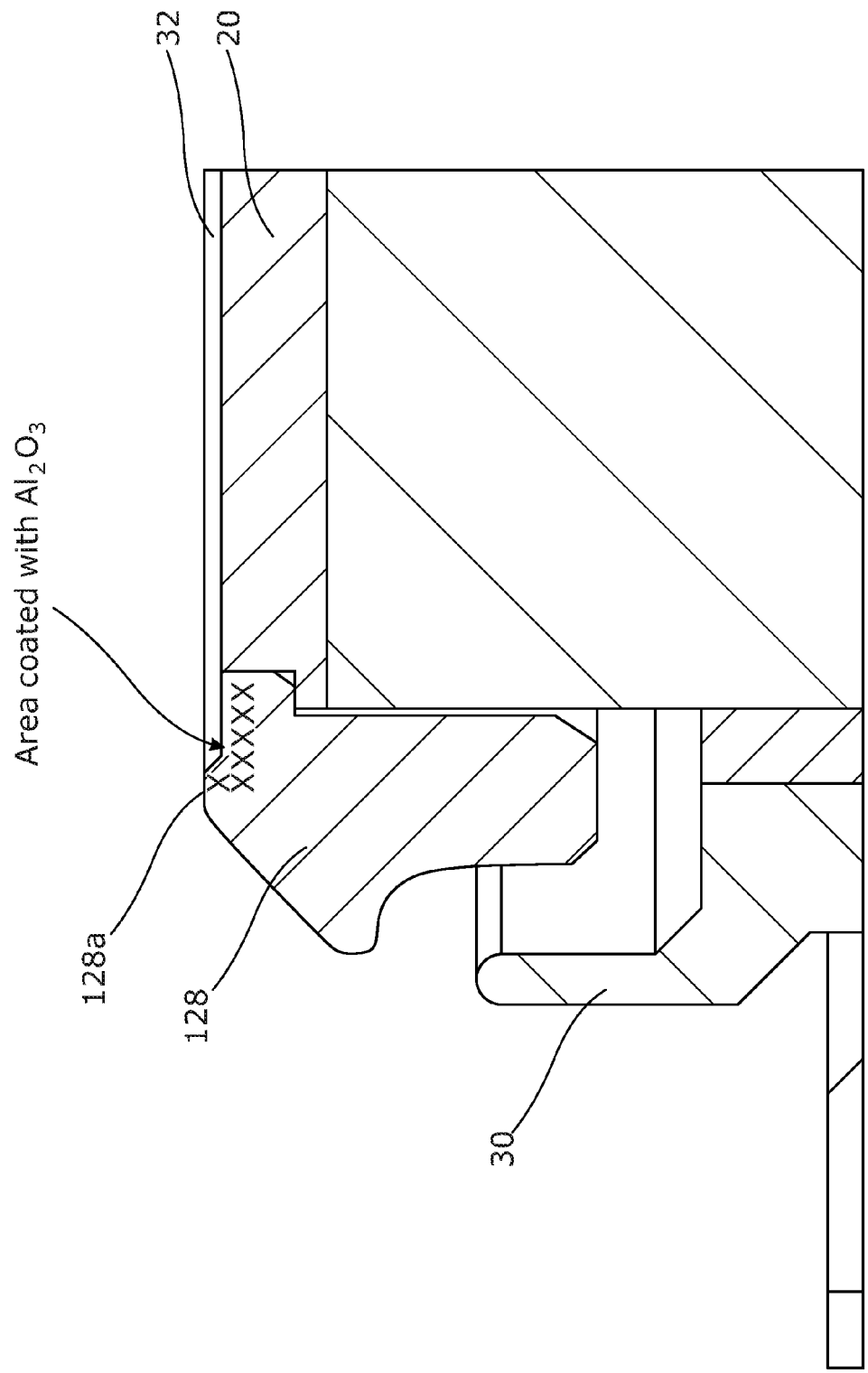
FIG. 3 shows a second embodiment of a back sputter ring.

FIG. 3 shows a second embodiment of a back sputter ring 128. FIG. 3 shows other elements which are essentially identical to elements shown in FIGS. 1 and 2. Identical reference numerals have been used to denote these common elements, namely the platen 20, wafer recess 32, and dark space shield 30. The back sputter ring 128 has a recess 128a comprising a wall portion and a horizontal surface for receiving the wafer. In the second embodiment, the recess 128a is coated with a dielectric coating such as aluminium oxide ($Al_2O_3$). Aluminium oxide has a much lower sputtering yield (aluminium oxide sputtering yield=0.18; aluminium sputtering yield=1.24 at 600 eV) than aluminium, and so it will etch much more slowly in comparison to aluminium. As a consequence, a reduced amount of sputtering takes place in the coated recess 128a and this in turn reduces the amount of material that is sputtered onto the edge and back side of the wafer. The skilled reader will appreciate that other dielectric materials and other techniques than coating techniques might be used in order to produce a back sputter wafer having a dielectric surface in the vicinity of the wafer.

Although the invention is not limited in this regard, it is believed to be desirable to utilise a back sputter ring with a relatively large surface area in relation to the surface of the substrate being etched. In this way the ratio of material sputtered from the back sputter ring to the material released from the substrate is relatively large. For example, if a 300 mm wafer is being etched, then a back sputter ring with a 300 mm inner diameter and a 340 mm outer diameter has been demonstrated to be effective at controlling the released particulate materials during the etching of a 100% PBO coated wafer. In this non-limiting embodiment, the back sputter ring has a surface area which is around 30% of that of the wafer.

Various experiments were performed using the first embodiment of the back sputter ring shown in FIG. 2 in combination with the apparatus shown in FIG. 1 to etch 100% PBO coated wafers. Experiments were also performed using a standard, prior art etch module. VPD ICPMS analysis of the etched wafers demonstrated that metallic contamination of the wafers can be kept below the typical values for a standard etch module. Table 1 shows the Al contamination of the wafers for both the standard etch and the novel etch apparatus of the invention. No increase in metallic contamination is seen with the apparatus of the invention, and in fact the results appear to indicate a lower level of contamination.

TABLE 1

|  | Al (atoms/$cm^2$) |
| --- | --- |
| Standard Etch | 8.97E13 |
| Novel Etch | 8.20E13 |

Figure 4:
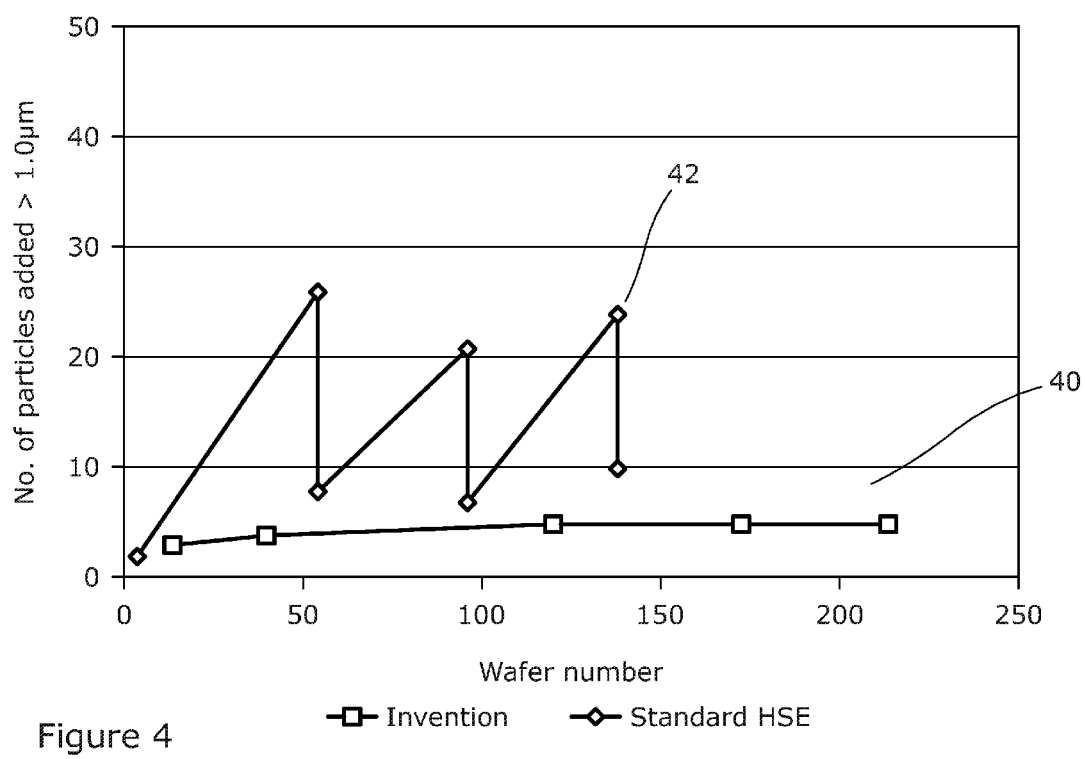
FIG. 4 shows contaminant particle levels on etched PBO coated wafers.

FIG. 4 shows contaminant particle levels on etched PBO coated wafers. Particles of greater than 1.0 microns were detected. Experiments were performed etching a number of wafers using the apparatus of the invention and also using a prior art technique where particle levels are recovered by stopping the etching of the wafers, introducing a metal disc into the chamber, and performing a pasting step where the metal disc is sputter etched. The line 40 indicates results obtained using the apparatus of the invention, and the line 42 indicates results obtained using the prior art metal disc pasting technique. With the prior art metal disc pasting technique, each pasting results in a sudden drop in particle levels. However, the particle levels observed using the prior art technique are substantially higher than the particle levels observed using the apparatus of the invention. Although each metal disc pasting step considerably reduces the number of particles measured on the wafers, it can be seen that even the lowest contamination level achieved after metal disc pasting is still higher than the contamination levels observed using the apparatus of the invention. Additionally, it is noted that the wafer etching process must be stopped in order to perform the metal disc pasting step, which results in a reduced throughput. In contrast, the pasting achieved through sputter etching of the back sputter ring is achieved during process etching of the wafers. As a result, there is no loss of throughput using the apparatus of the invention.

Figure 5:
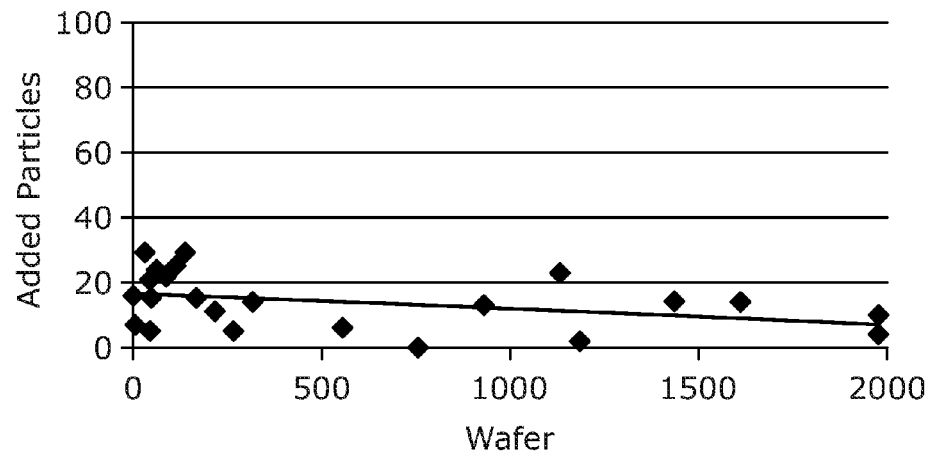
FIGS. 5(a) and (b) show particle levels on etched wafers for particles less than 0.2 microns and particles greater than 1.0 micron in size, respectively.
Figure 5:
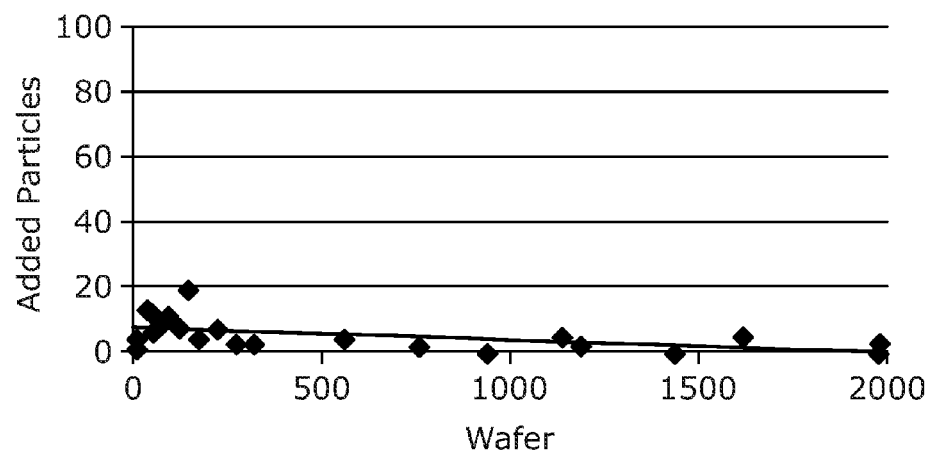
Figure 6:
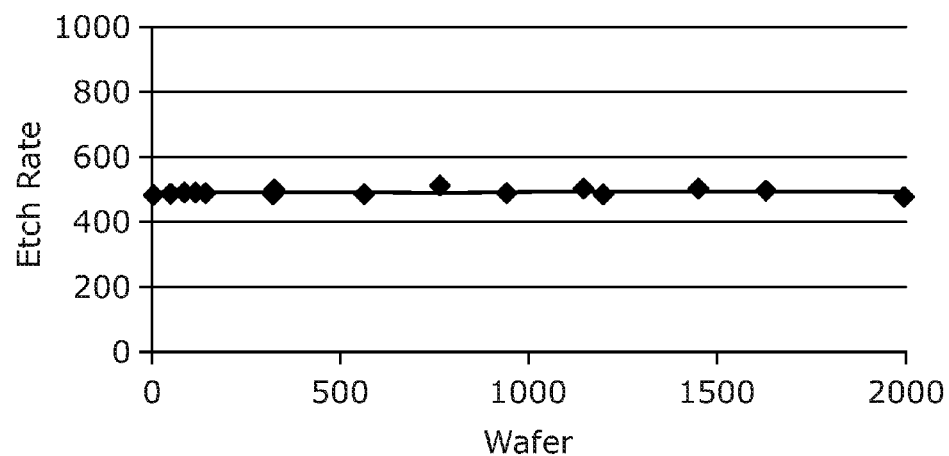
FIGS. 6(a) and (b) show etch rate and etch uniformity, respectively, measured during a marathon test to etch wafers.
Figure 6:
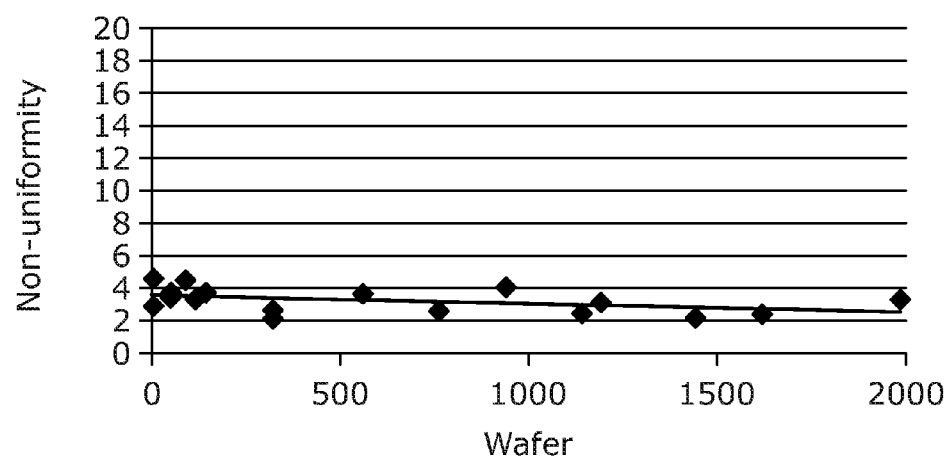

FIG. 5 shows the results of a marathon test of the apparatus of the invention to etch 100% PBO coated wafers. FIG. 5 shows the particle levels observed on the wafers for (a) particles greater than 0.2 microns in size and (b) particles greater than 1.0 micron in size. In both instances it can be seen that good particle performance is maintained over nearly 2000 wafers. FIG. 6 shows (a) etch rate (in A/minute) and (b) etch uniformity (1 sigma, with 3 mm edge exclusion) measured during the marathon test of the apparatus of the invention to etch 100% PBO coated wafers. It can be seen that good etch rate and uniformity repeatability are achieved.

In the examples provided above, the back sputter ring was fabricated from aluminium. The back sputter ring may also be provided with an aluminium oxide coating in the vicinity of the wafer as described in relation to FIG. 3. The use of other materials is within the scope of the invention. For example, an aluminium alloy or copper might be contemplated. Another possibility is to use a material such as titanium which is a more effective "getter" material. The use of a getter material has the advantage that gaseous components caused by unwanted outgassing can be removed from the atmosphere within the chamber, resulting in better vacuum performance.

What is claimed is:

1. An ICP plasma etching apparatus for etching a substrate comprising:
at least one chamber;
a substrate support within the chamber, the substrate support comprising a platen positioned above a bottom of the chamber, the platen having a support surface dedicated to receive and support a substrate when the substrate is etched in the chamber;
a plasma production device for producing a plasma for use in etching the substrate; and
a protective structure comprising a body of metallic material which surrounds the substrate support; and
a dark space shield which extends around the substrate support and terminates at a level below the level of the platen,
in which the protective structure is arranged to be electrically biased, the body of metallic material of the protective structure has a lower part situated below the level of the support surface of the substrate support and an upper part situated above the level of the support surface of the substrate support so that, in use, a peripheral portion of the substrate received on the support surface of the substrate support is protected from unwanted deposition of material by the protective structure, and the metallic material can be sputtered from the protective structure onto an interior surface of the chamber to adhere particulate material to the interior surface,
the dark space shield has a protective structure receiving portion that extends around and is spaced from the substrate support, and
a portion of the protective structure is received in the protective structure receiving portion of the dark space shield as spaced therefrom so as to define a gap therebetween, whereby the extent of plasma propagating around the protective structure into a region, including the gap, between the level of the platen and the bottom of the chamber is minimized by the presence of the dark space shield.

2. A plasma etching apparatus according to claim 1 in which the metallic material is aluminum, an aluminum alloy, or copper.

3. A plasma etching apparatus according to claim 1 in which the metallic material is also a getter material.

4. A plasma etching apparatus according to claim 3 in which the metallic material is titanium.

5. A plasma etching apparatus according to claim 1 in which the protective structure is a ring structure.

6. A plasma etching apparatus according to claim 1 in which the protective structure has a substrate receiving surface coplanar with the support surface of the substrate support.

7. A plasma etching apparatus according to claim 6 in which the protective structure has a recess, and the substrate receiving surface delimits part of the recess.

8. A plasma etching apparatus according to claim 1 in which the protective structure has a region adjacent to the support surface of the substrate which, in use, is proximal to the substrate received on the support surface, and said region is formed from a dielectric material.

9. A plasma etching apparatus according to claim 8 in which the dielectric material is present as a coating on the body of metallic material of the protective structure.

10. A plasma etching apparatus according to claim 8 in which the protective structure has a substrate receiving surface coplanar with the support surface of the substrate support, and the substrate receiving surface of the protective structure is formed from the dielectric material.

11. A plasma etching apparatus according to claim 8 in which the protective structure has a substrate receiving surface coplanar with the support surface of the substrate support and a wall portion surface subtending an angle with the substrate receiving surface, the protective structure has a recess therein, the recess is delimited by the substrate receiving surface and the wall portion surface, and the substrate receiving surface and the wall portion surface are formed from the dielectric material.

12. A plasma etching apparatus according to claim 8 in which the dielectric material is aluminum oxide.

13. A plasma etching apparatus according to claim 1 in which the protective structure comprises a region distal from the substrate support having at least one plasma facing surface which is inclined away from the substrate support.

14. A plasma etching apparatus according to claim 13 in which the region distal from the substrate support has a single plasma facing surface which is inclined away from the substrate support.

15. A plasma etching apparatus according to claim 13 in which the region distal from the substrate support is chamfered, beveled, coved or of ogee shape.

16. A plasma etching apparatus according to claim 1 in which the substrate support is electrically biased, and the protective structure is in electrical contact with the substrate support to provide an electrical bias on the protective structure.

17. A plasma etching apparatus according to claim 1 in which the chamber comprises a region formed from a dielectric material for transmission of RF energy, in which the plasma product device causes the RF energy to be coupled into the chamber through said region.

18. A plasma etching apparatus according to claim 1 in which the apparatus is a sputter etch apparatus.

19. A method of reducing contamination by particulate material in a plasma etching apparatus of the kind used for etching a substrate, comprising steps of:
providing an apparatus having the at least one chamber, substrate support and plasma production device according to claim 1 and a protective structure comprising a body of metallic material which surrounds the substrate support, the body of metallic material of the protective structure having a lower part situated below the level of the support surface of the substrate support and an upper part situated above the level of the support surface of the substrate support;
producing a plasma in the chamber which sputters metallic material from the protective structure onto an interior surface of the chamber to adhere particulate material which has been deposited on an interior surface of the chamber to the interior surface of the chamber,
wherein the protective structure is electrically biased during the step of producing a plasma in the chamber; and
providing a dark space shield having a protective structure receiving portion around the substrate support with the protective structure receiving portion spaced apart from the substrate support, such that a portion of the protective structure is received in the protective structure receiving portion as spaced therefrom such that a gap is defined therebetween, and such that the dark space shield including the protective structure receiving portion is located below the level of the platen,
whereby the extent to which plasma propagates around the protective structure and into a region, including the gap, between the level of the platen and the bottom of the chamber is minimized.

20. A method according to claim 19 in which the sputtering of the metallic material from the protective structure is performed concurrently with the etching of the substrate while the substrate is received on and supported by the support surface of the substrate support and a peripheral part of the substrate is protected from unwanted deposition of material by the protective structure.

21. A plasma etching apparatus according to claim 1 in which the protective structure receiving portion of the dark space shield is an annular flange that is spaced radially outwardly of said portion of the protective structure such that said portion of the protective structure is interposed between the annular flange and the substrate support.

22. A method according to claim 19 in which the protective structure receiving portion of the dark space shield is an annular flange, and the dark space shield is provided around the substrate support such that the annular flange is spaced radially outwardly of said portion of the protective structure and said portion of the protective structure is interposed between the protective structure receiving portion of the dark space shield and the substrate support.

* * * * *